US011491358B2

(12) United States Patent
Kalyan et al.

(10) Patent No.: US 11,491,358 B2
(45) Date of Patent: Nov. 8, 2022

(54) FIRE CONTROL PANEL MODULAR ASSEMBLY

(71) Applicant: Honeywell International Inc., Charlotte, NC (US)

(72) Inventors: Vivek Kalyan, Charlotte, NC (US); Joern Buttstaedt, Charlotte, NC (US); Petter Bye, Charlotte, NC (US); Nicolae Pintea, Charlotte, NC (US); Adrian-Tiberiu Florea, Charlotte, NC (US); Unmesh Kulkarni, Charlotte, NC (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/090,390

(22) Filed: Nov. 5, 2020

(65) Prior Publication Data

US 2021/0138285 A1    May 13, 2021

(30) Foreign Application Priority Data

Nov. 8, 2019   (EP) ..................................... 19207927

(51) Int. Cl.
*H05K 7/14*   (2006.01)
*A62C 37/36*   (2006.01)

(52) U.S. Cl.
CPC ........... *A62C 37/04* (2013.01); *H05K 7/1401* (2013.01)

(58) Field of Classification Search
CPC ...... A62C 37/04; H05K 7/1401; G08B 17/00; G08B 25/14
See application file for complete search history.

(56) References Cited

U.S. PATENT DOCUMENTS

2010/0183365 A1* 7/2010 Deinhardt ............ H05K 7/1409
                                                                           403/322.4
2020/0051421 A1   2/2020 Mandelkau

FOREIGN PATENT DOCUMENTS

DE    102016120081 A1    4/2018
WO       2007115249 A2   10/2007

OTHER PUBLICATIONS

Communication Pursuant to Article 94(3) EPC Examination Report for related European Application No. 19207927.5, dated Oct. 27, 2021 (6 pgs).
Extended Search Report from priority European Application No. 19207927.5 dated May 4, 2020 (8 pages).

* cited by examiner

*Primary Examiner* — James Wu
*Assistant Examiner* — Hung Q Dang
(74) *Attorney, Agent, or Firm* — Brooks, Cameron & Huebsch, PLLC

(57) ABSTRACT

Fire control panel modular assemblies are described herein. In some examples, one or more embodiments include a fire control panel module (100) including a locking ridge (102), and a fire control panel module carrier (112) including a module carrier slot (114), a locking tab (130), and a release button (116), wherein the module carrier slot (114) is configured to accept the fire control panel module (100) therein, and the locking tab (130) is configured to engage the locking ridge (102) to releasably retain the fire control panel module (100) in the module carrier slot (114).

14 Claims, 6 Drawing Sheets

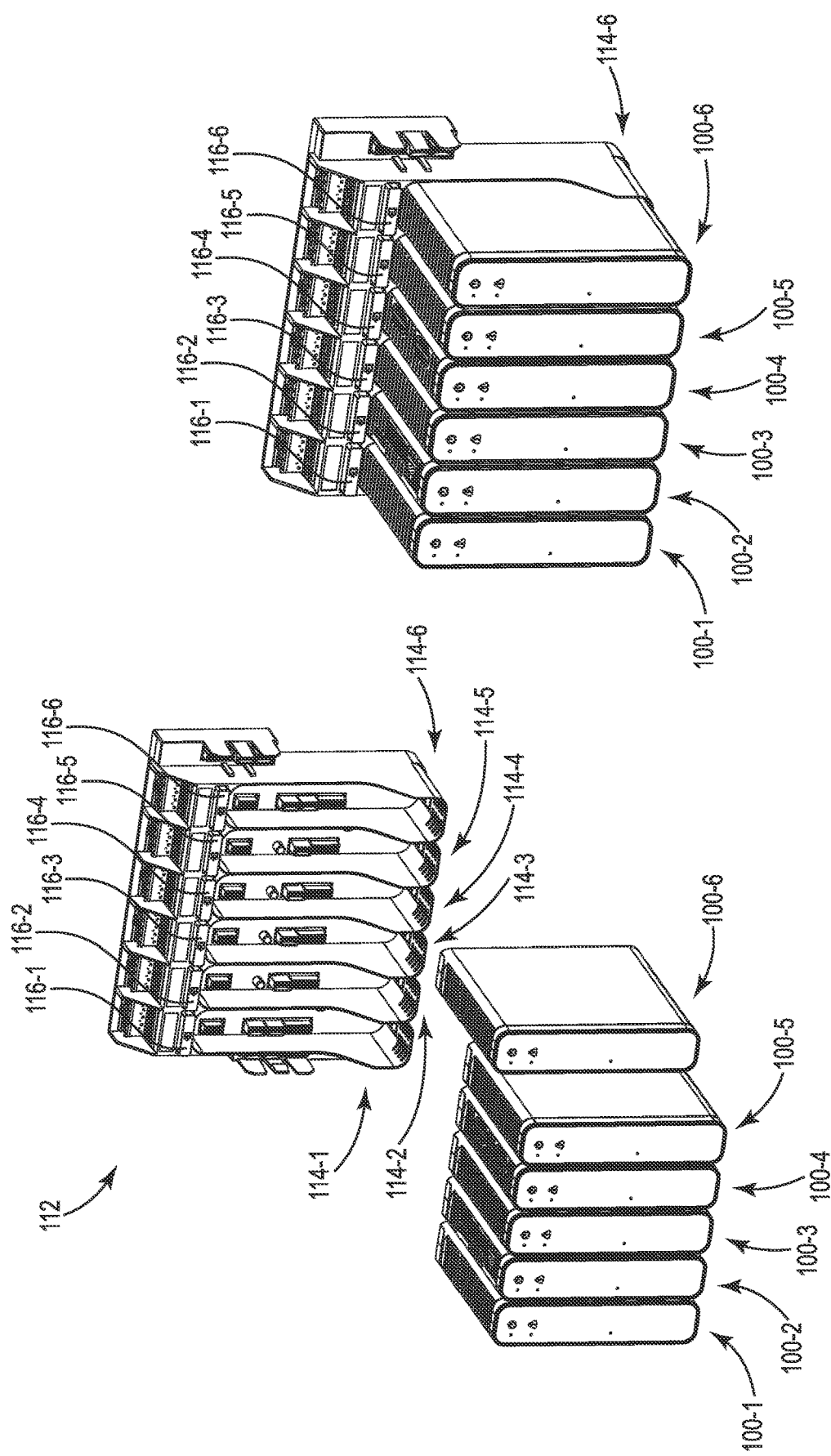

FIRE CONTROL PANEL MODULAR ASSEMBLY

TECHNICAL FIELD

The present disclosure relates to fire control panel modular assemblies.

BACKGROUND

Facilities, such as commercial facilities, office buildings, hospitals, and the like, may have fire control systems that can be used during an emergency situation (e.g., a fire) to manage a fire event in and/or around the facility. For example, a fire control system may include sensors such as smoke detectors, heat detectors, and flame detectors, among other types of sensors, as well as control equipment such as fire control panels.

Fire control panels can control components of a fire control system in a facility. For example, a fire control panel can monitor and/or control fire hardware devices in the facility. For example, in an emergency situation such as a fire, a fire control panel can receive signals from a fire hardware device such as a sensor, and/or control other fire hardware devices to perform fire control operations.

Some fire control panels can be modular in design. However, installing, maintaining, replacing, repositioning, or other interactions with the module(s) of previous fire control panels may involve the use of tools.

BRIEF DESCRIPTION OF THE DRAWINGS

FIG. 2A is a perspective view of an example fire control panel module carrier and a plurality of example fire control panel modules in accordance with one or more embodiments of the present disclosure.

FIG. 2B is a perspective view of an example fire control panel module carrier with a plurality of example fire control panel modules inserted therein in accordance with one or more embodiments of the present disclosure.

DETAILED DESCRIPTION

Figure 1B:
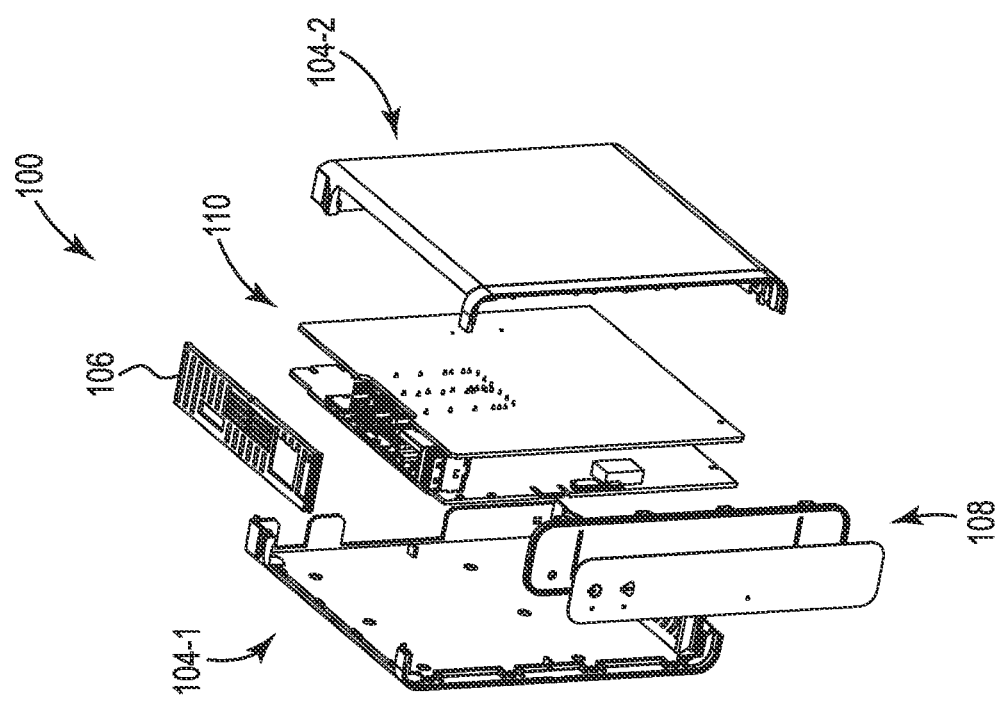
FIG. 1B is an exploded view of an example fire control panel module in accordance with one or more embodiments of the present disclosure.

Fire control panel modular assemblies are described herein. In some examples, one or more embodiments include a fire control panel module including a locking ridge, and a fire control panel module carrier including a module carrier slot, a locking tab, and a release button, wherein the module carrier slot is configured to accept the fire control panel module therein, and the locking tab is configured to engage the locking ridge to releasably retain the fire control panel module in the module carrier slot.

Fire control panels can be utilized in a facility to manage fire hardware devices in the facility. As used herein, the term "fire control panel" refers to a controlling component of a fire control system. For example, a fire control panel can receive information from fire hardware devices in the facility, monitor operational integrity of fire hardware devices in the facility, control fire hardware devices in the facility, and/or transmit information about fire hardware devices in the facility, among other operations. As an example, a fire control panel can receive information from, monitor, control, and/or transmit information about sensors in the facility. In the present disclosure, the term "panel" may be used to refer to a fire control panel.

In accordance with the present disclosure, a panel can include one or more modules. Different modules can perform different tasks. Different modules can be used for different applications. A user (e.g., a technician) can install a number of modules in a panel according to the needs, requirements, and/or desired performance of a fire control system. The present disclosure is not intended to limit the type and/or functionality of modules that can be utilized in a fire control panel though it is noted that examples of such modules can include power supply modules, battery charging modules, control unit modules (e.g., central processing units), fire control system loop modules, input/output (I/O) modules.

In previous approaches, a user may use a tool to interact with the fasteners that affix modules to a panel. For example, if a user is removing, repositioning, installing, maintaining, replacing, or repositioning a module, a tool may be utilized (e.g., required). In some previous approaches, for instance, a screwdriver may be implemented to affix and/or remove modules from a panel. Embodiments of the present disclosure, however, do not require the use of any tools. Rather, a user can readily insert a module into a module carrier slot where it is retained by a locking tab. Once retained, the module can be removed by the press of a button, which releases the tab from the module. In some embodiments, the modules can be color-coded according to their type and/or functionality. Accordingly, modular assemblies in accordance with the present disclosure afford a more user-friendly experience and decrease time spent removing, repositioning, installing, maintaining, replacing, and/or repositioning fire control panel modules.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure and should not be taken in a limiting sense.

As used herein, "a", "an", or "a number of" something can refer to one or more such things, while "a plurality of" something can refer to more than one such things. For example, "a number of components" can refer to one or more components, while "a plurality of components" can refer to more than one component.

Figure 1A:
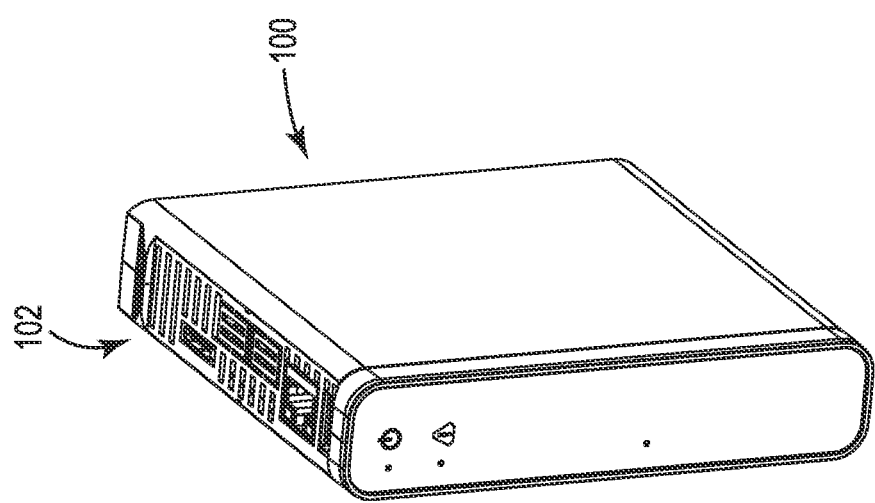
FIG. 1A is a perspective view of an example fire control panel module in accordance with one or more embodiments of the present disclosure.

FIG. 1A is a perspective view of an example fire control panel module 100 (sometimes referred to herein simply as "module 100") in accordance with one or more embodiments of the present disclosure. As shown in FIG. 1A. FIG. 1B is an exploded view of an example fire control panel module 100 in accordance with one or more embodiments of the present disclosure. FIGS. 1A and 1B may be referred to cumulatively herein as "FIG. 1." Other figures herein may follow a similar convention. For example, FIGS. 5A and 5B may be referred to cumulatively as "FIG. 5." As shown in FIG. 1, the module 100 can be substantially rectangular in shape with six outer surfaces. In some embodiments, the edges of the module can be rounded and/or radiused. The module 100 can include a module locking ridge 102, which may be referred to herein simply as "locking ridge 102" or "ridge 102". The ridge 102 can engage a locking tab (discussed further below) such that the module 100 is retained in a module carrier slot. As shown in FIG. 1B, the module 100 can include a first side plate 104-1, a second side plate 104-2, a top plate 106, a front assembly 108, and circuitry 110. The ridge 102 can be formed partially by the first side plate 104-1 and partially by the second side plate 104-2.

FIG. 2A is a perspective view of an example fire control panel module carrier and a plurality of example fire control panel modules in accordance with one or more embodiments of the present disclosure. FIG. 2B is a perspective view of an example fire control panel module carrier with a plurality of example fire control panel modules inserted therein in accordance with one or more embodiments of the present disclosure. The example embodiment illustrated in FIGS. 2 and 3 includes a module carrier 112 including six module carrier slots: a first module carrier slot 114-1, a second module carrier slot 114-2, a third module carrier slot 114-3, a fourth module carrier slot 114-4, a fifth module carrier slot 114-5, and a sixth module carrier slot 114-6 (cumulatively referred to herein as "module carrier slots 114" and generally referred to as "module carrier slot 114"). However, it is noted that module carriers in accordance with the present disclosure are not limited to a particular quantity of module carrier slots and the embodiments illustrated in the Figures herein are not to be taken in a limiting sense. A module carrier 112 in accordance with the present disclosure can include one module carrier slot, two module carrier slots, thirty module carrier slots, etc.

Each of the module carrier slots 114 is configured to accept a respective module. FIG. 2 illustrates six modules: a first module 100-1, a second module 100-2, a third module 100-3, a fourth module 100-4, a fifth module 100-5, and a sixth module 100-6 (sometimes cumulatively referred to herein as "modules 100"). In some embodiments, the modules 100 can include indicators of their type and/or function.

For instance, a power supply module (e.g., module 100-1) may be indicated by a first color (e.g., white) on a front face thereof and a loop module (e.g., module 100-5) may be indicated by a second color (e.g., purple) on a front face thereof. It is noted that these colors are provided for purposes of example and are not to be taken in a limiting sense. Additionally, other indicators of module type and/or functionality may be provided (e.g., textually, in a computer-readable format, etc.).

In some embodiments, each of the modules 100 is a different type of module. In some embodiments, two or more of the modules 100 are a same type of module. In some embodiments, a particular module carrier slot can accept more than one type of module. In some embodiments, a particular module carrier slot can accept only one type of module. In some embodiments, a particular module carrier slot can accept a particular plurality of module types. For example, the module carrier slot 114-1 may include one or more ports that are not present in another module carrier slot (e.g., module carrier slot 114-2). The additional port(s) may be used for a particular type of module (e.g., a power supply module) and not used for a different type of module (e.g., a loop module).

Discussed further below, the module carrier 112 can include a plurality of actuatable components (referred to herein as "buttons"). For instance, as shown in FIG. 2, the module carrier 112 includes a first button 116-1, a second button 116-2, a third button 116-3, a fourth button 116-4, a fifth button 116-5, and a sixth button 116-6 (cumulatively referred to herein as "buttons 116"). As discussed below, each of the buttons 116 is associated with a respective module carrier slot. For instance, the button 116-1 is associated with the module carrier slot 114-1. FIG. 2B shows the modules 100 inserted into respective module carrier slots 114 (though only a portion of a single module carrier slot 114-6 is visible in FIG. 2B as the other module carrier slots 114 are obscured by the inserted modules 100). Actuation of one of the buttons (e.g., using a fingertip) causes the corresponding module to be released from its module carrier slot. For example, actuation of the button 116-3 causes the module 100-3 to be released from the module carrier slot 114-3.

Figure 3B:
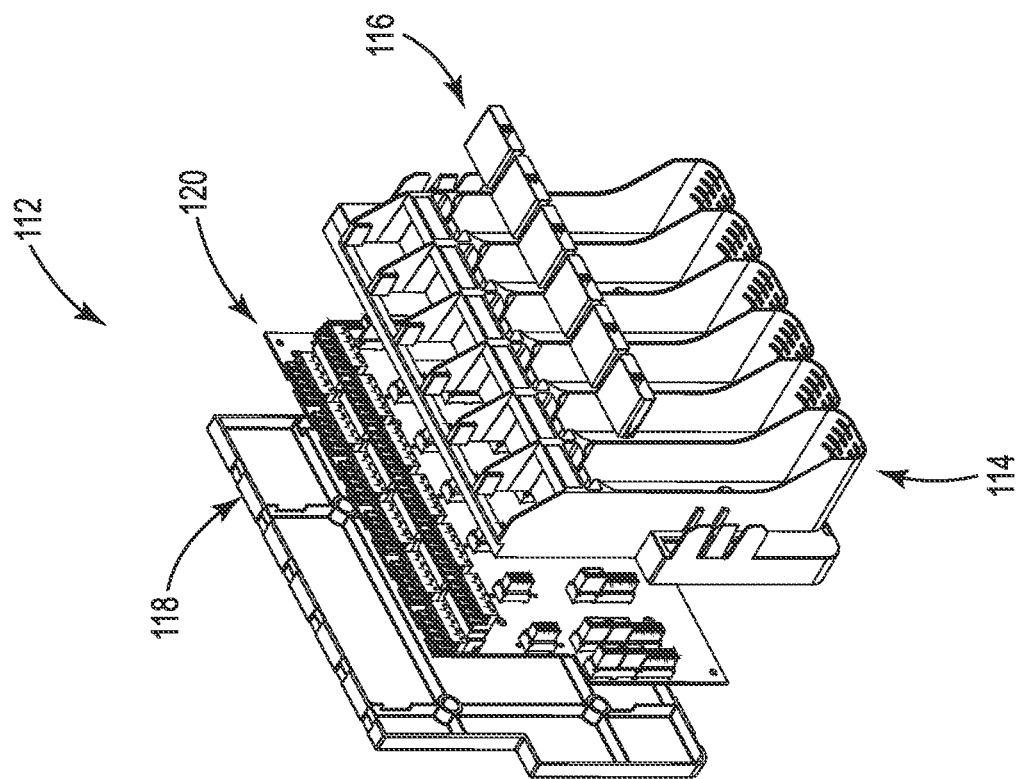
FIG. 3B is an exploded view of an example fire control panel module carrier in accordance with one or more embodiments of the present disclosure.
Figure 3A:
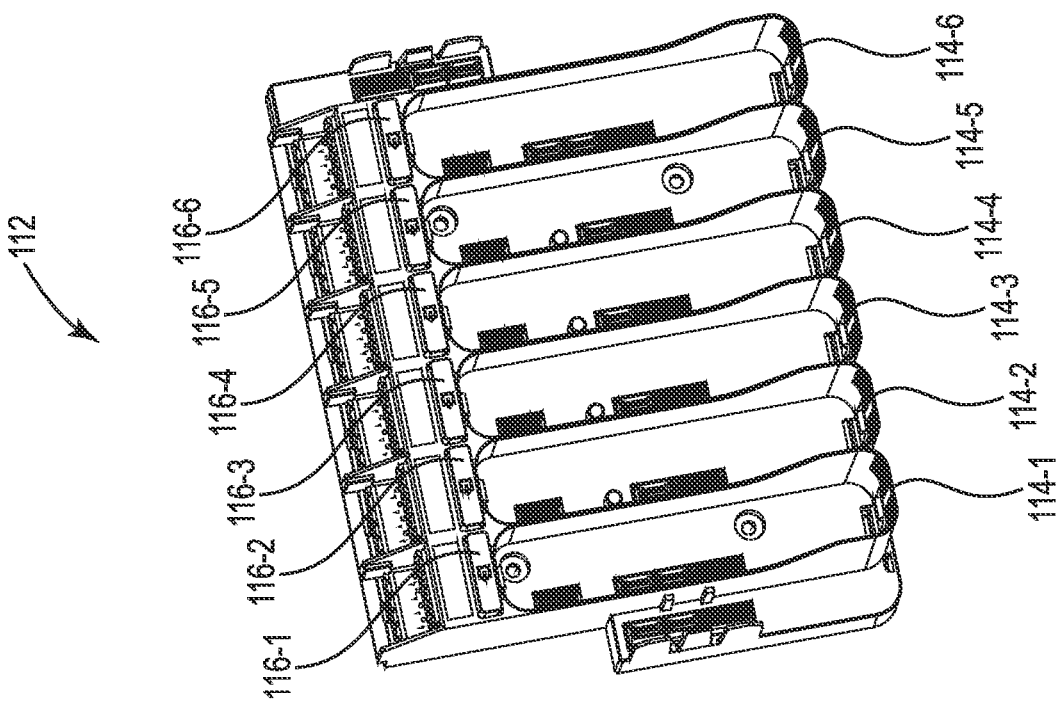
FIG. 3A is another perspective view of an example fire control panel module carrier in accordance with one or more embodiments of the present disclosure.

FIG. 3A is another perspective view of an example fire control panel module carrier in accordance with one or more embodiments of the present disclosure. FIG. 3B is an exploded view of an example fire control panel module carrier in accordance with one or more embodiments of the present disclosure. As shown, the module carrier 112 can include a module carrier backplate 118 and module carrier circuitry 120. The module carrier slots 114 may extend further outward on the bottom portions thereof so as to provide support for the modules 100 and/or prevent the modules 100 from falling when any of the buttons 116 are depressed.

Figure 4B:
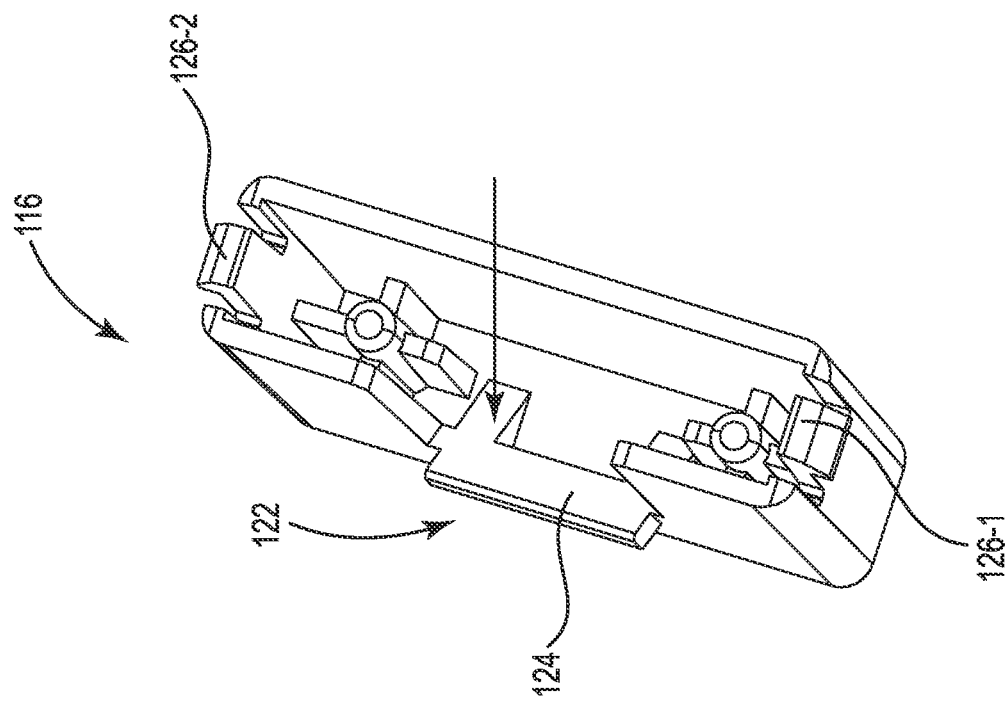
FIG. 4B is a view of an interior of an example release button in accordance with one or more embodiments of the present disclosure.
Figure 4A:
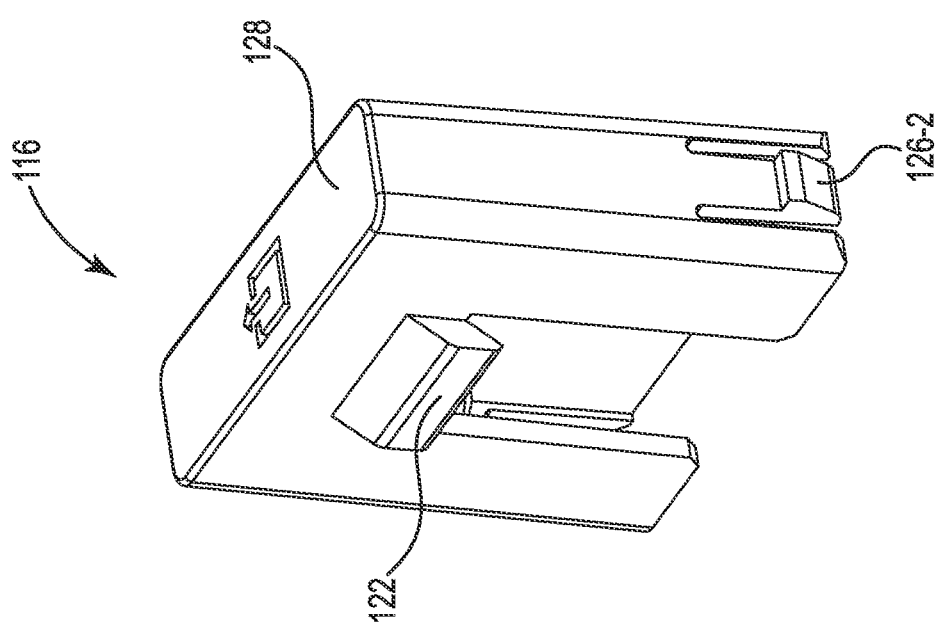
FIG. 4A is a perspective view of an example release button in accordance with one or more embodiments of the present disclosure.

FIG. 4A is a perspective view of an example release button 116 in accordance with one or more embodiments of the present disclosure. FIG. 4B is a view of an interior of an example release button 116 in accordance with one or more embodiments of the present disclosure. The button 116 can include a front surface 128, an engagement member 122 having a sliding surface 124, a first retention tab 126-1, and a second retention tab 126-2 (referred to cumulatively as "retention tabs 126"). The retention tabs 126 can secure the button 116 to the module carrier 112 while permitting a degree of translational movement of the button 116 inward with respect to the module carrier 112 (e.g., towards the module carrier 112). If desired, the retention tabs 126 can be depressed inward for removal of the button 116 from the module carrier 112.

The engagement member 122 can be a protrusion from a surface of the button 116. The engagement member 122 can be an angled protrusion from a surface of the button 116. In some embodiments, the angle is between 30 and 40 degrees. In some embodiments, the angle is 35 degrees. The engagement member and the sliding surface 124 are discussed in further detail in connection with FIGS. 5 and 6.

Figure 5B:
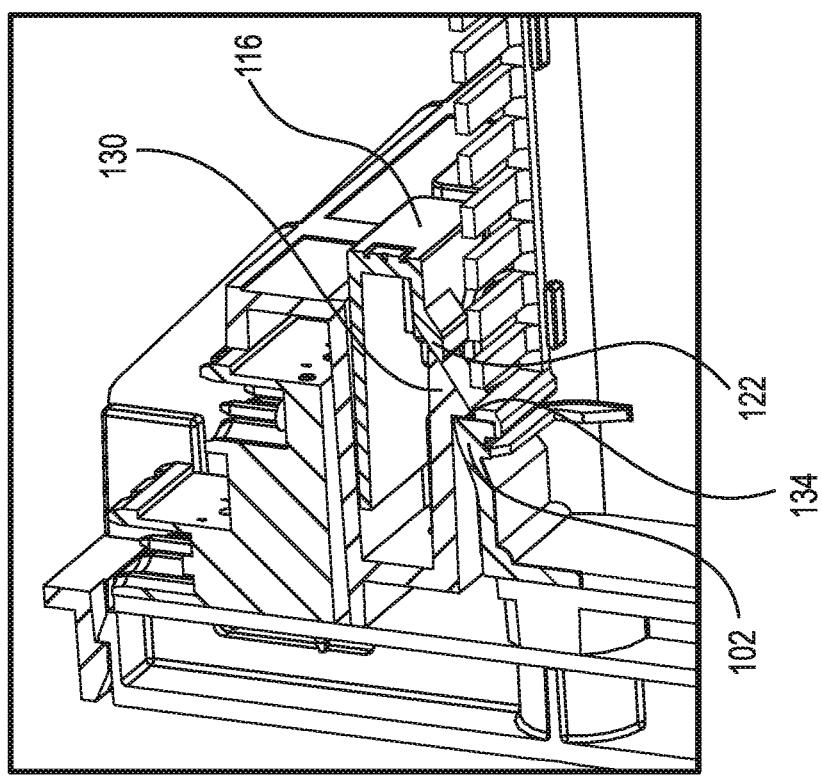
FIG. 5B is another cross-sectional view of an example release button in the first position in accordance with one or more embodiments of the present disclosure.
Figure 5A:
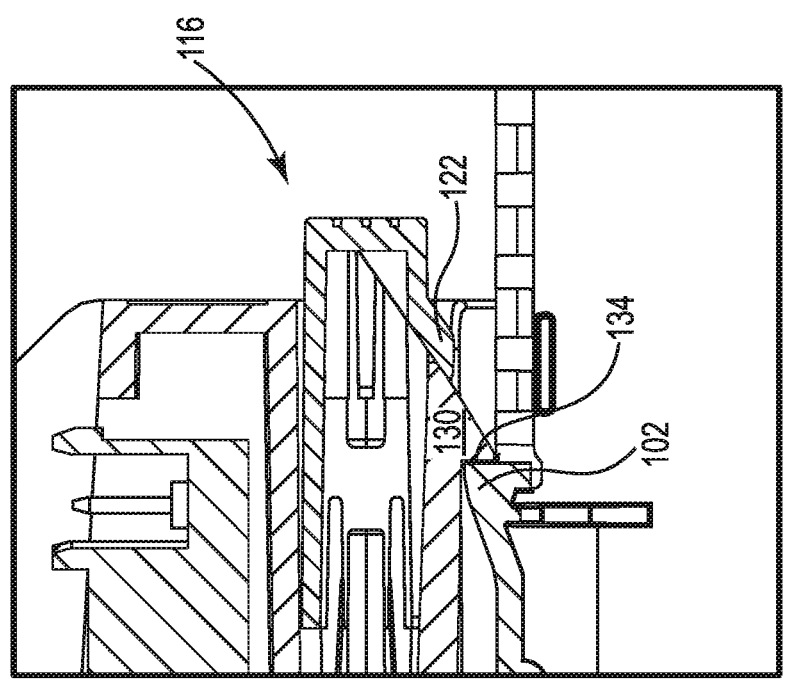
FIG. 5A is a cross-sectional view of an example release button in a first position in accordance with one or more embodiments of the present disclosure.
Figure 6B:
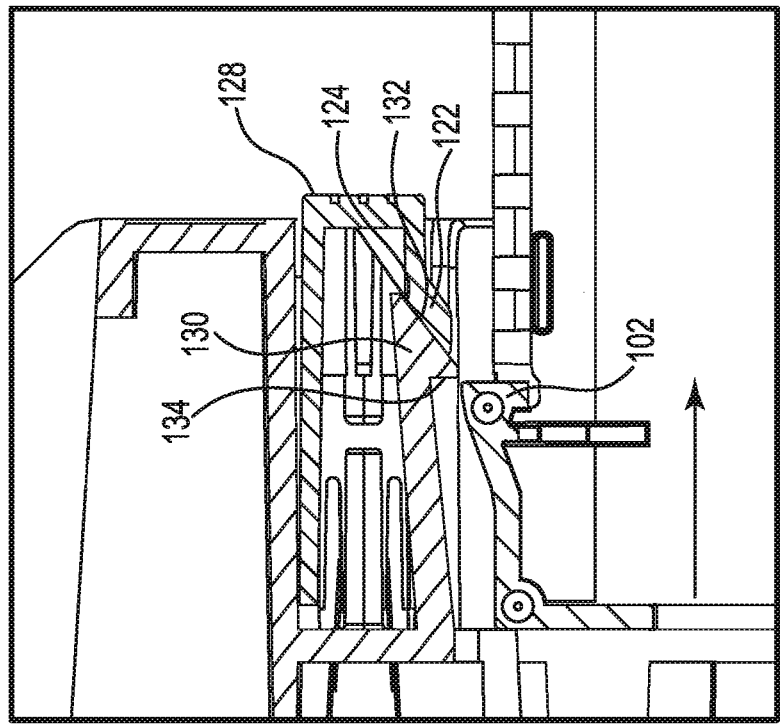
FIG. 6B is another cross-sectional view of an example release button in the second position in accordance with one or more embodiments of the present disclosure.
Figure 6A:
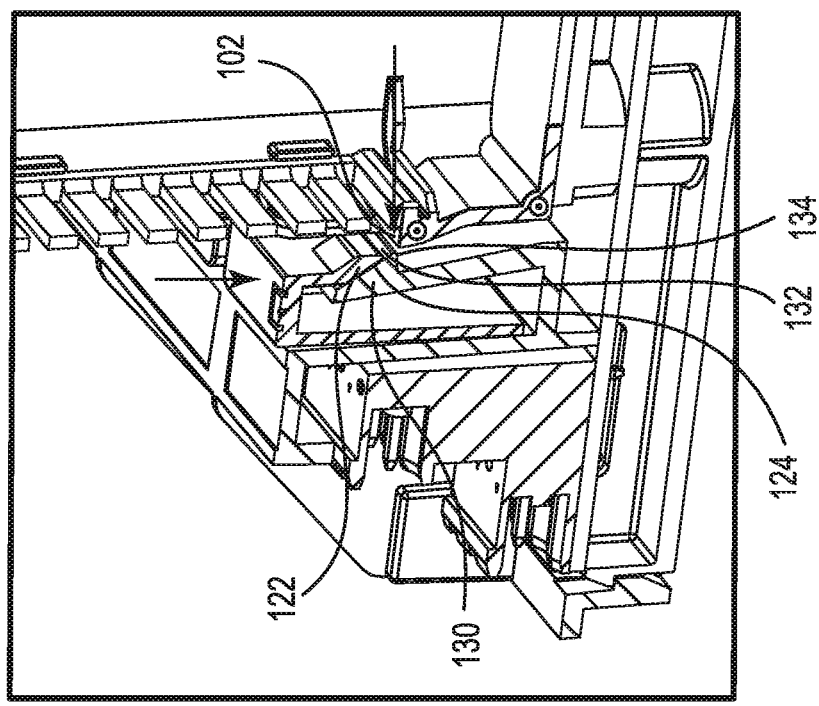
FIG. 6A is a cross-sectional view of an example release button in a second position in accordance with one or more embodiments of the present disclosure

FIG. 5A is a cross-sectional view of an example release button in a first position in accordance with one or more embodiments of the present disclosure. FIG. 5B is another cross-sectional view of an example release button in the first position in accordance with one or more embodiments of the present disclosure. FIG. 6A is a cross-sectional view of an example release button in a second position in accordance with one or more embodiments of the present disclosure. FIG. 6B is another cross-sectional view of an example release button in the second position in accordance with one or more embodiments of the present disclosure. As will be appreciated, FIGS. 5A and 5B illustrate a position of the release button 116 when the module 100 is retained by the module carrier 114 (e.g., an "unpushed" position); FIGS. 6A and 6B illustrate a position of the release button 116 when the module 100 is released from the module carrier 114 (e.g., a "pushed" position).

The release button 116 can be actuated (e.g., depressed) via a force applied to the front surface 128 of the release button 116 causing the release button 116 to move from the first position to the second position. A direction of travel from the first position to the second position (e.g., an axis extending from the first position to the second position) is shown by a downward arrow in FIG. 6A, for instance.

Actuation of the release button 116 inward with respect to the module carrier 112 from the first position to the second position can cause the engagement member 122 to translate (e.g., slide) along a portion of the locking tab 130. More specifically, the sliding surface 124 of the engagement member 122 can slide along the locking tab sliding surface 132 of the locking tab 130. As a result, the locking tab 130 is forced towards a center (e.g., a hollow center) of the release button 116. The locking tab 130 can be flexible such that the sliding of the sliding surface 124 along the locking tab sliding surface 132 bends the locking tab 130 towards the center of the release button 116. This bending causes the locking tab 130 to be released from the locking ridge 102. More specifically, this bending causes an abutment surface 134 of the locking tab 130 to be released from contact with the locking ridge 102.

The engagement member 122 (e.g., the engagement member sliding surface 124) can be angled from the axis extending from the first position to the second position. In some embodiments, the angle is between 30 and 40 degrees. In some embodiments, the angle is 35 degrees. The angle can be selected based on an amount of frictional engagement with the sliding surface 124 and the locking tab sliding surface 132 and/or a desired amount of force applied to the front surface 128 of the release button 116 sufficient to cause the locking tab 130 to be released from the locking ridge 102. When the locking tab 130 and the locking ridge 102 are no longer in contact, the module 100 is no longer held in retention by the module carrier 114 and can be removed (e.g., pulled out) from the module carrier 114.

Inserting the module 100 into the module carrier 114 can be accomplished without separate actuation of the release button 116. For instance, the module 100 can be inserted into the module carrier 114 and pressed such that the sliding surface 124 slides along the locking tab sliding surface 132 and bends the locking tab 130 towards the center of the release button 116. The module 100 can be inserted a sufficient depth into the module carrier 114 such that the release button returns from its bent position towards the center of the release button 116, moves toward the module 100, and the locking ridge 102 engages the abutment surface 134 of the release button 116.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

The invention claimed is:

1. A fire control panel modular assembly, comprising:
   a fire control panel module including a locking ridge; and
   a fire control panel module carrier including a module carrier slot, a locking tab including a locking tab sliding surface, and a release button including a release button sliding surface, wherein:
      the module carrier slot is configured to accept the fire control panel module therein;
      the locking tab is configured to engage the locking ridge to releasably retain the fire control panel module in the module carrier slot; and
      actuation of the release button from a first position inward to a second position causes the release button sliding surface to translate along the locking tab sliding surface.

2. The fire control panel modular assembly of claim 1, wherein the fire control panel module is configured to be released from the module carrier slot without the use of a tool.

3. The fire control panel modular assembly of claim 1, wherein the release button is configured to be actuated to release the locking tab from the locking ridge such that the fire control panel module is released from the module carrier slot.

4. The fire control panel modular assembly of claim 1, wherein the release button sliding surface is angled with respect to an axis extending from the first position to the second position.

5. The fire control panel modular assembly of claim 4, wherein the release button sliding surface is angled between 30 and 40 degrees with respect to the axis extending from the first position to the second position.

6. The fire control panel modular assembly of claim 4, wherein the release button sliding surface is angled 35 degrees with respect to the axis extending from the first position to the second position.

7. A system comprising the fire control panel modular assembly of claim 1, comprising:
 a fire control panel module including a locking ridge; and
 a fire control panel module carrier including a module carrier slot, a locking tab including a locking tab sliding surface, and a release button including a release button sliding surface, wherein:
  the module carrier slot is configured to accept the fire control panel module therein;
  the locking tab is configured to engage the locking ridge to releasably retain the fire control panel module in the module carrier slot; and
  actuation of the release button from a first position inward to a second position causes the release button sliding surface to translate along the locking tab sliding surface;
 an additional fire control panel module including an additional locking ridge; and
 the fire control panel module carrier including an additional module carrier slot an additional locking tab and an additional release button, wherein:
  the additional module carrier slot is configured to accept the additional fire control panel module therein; and
  the additional locking tab is configured to engage the additional locking ridge to releasably retain the additional fire control panel module in the additional module carrier slot.

8. The system of claim 7, wherein the fire control panel module includes an indicator of a first color on a front surface thereof, and wherein the additional fire control panel module includes an indicator of a second color on a front surface thereof.

9. The system of claim 7, wherein the additional module carrier slot is configured to accept the additional fire control panel module or the fire control panel module therein, and wherein the module carrier slot is configured to accept only the fire control panel module therein.

10. The system of claim 7, wherein the fire control panel module and the additional fire control panel module are each one of:
 a power supply module;
 a battery charging module;
 a control unit module;
 a fire control system loop module; and
 an input/output module.

11. A method for providing a fire control panel modular assembly, comprising:
 providing a fire control panel module including a locking ridge; and
 providing a fire control panel module carrier including a module carrier slot a locking tab including a locking tab sliding surface, and a release button including a release button sliding surface, wherein:
  the module carrier slot is configured to accept the fire control panel module therein;
  the locking tab is configured to engage the locking ridge to releasably retain the fire control panel module in the module carrier slot; and
  actuation of the release button from a first position inward to a second position causes the release button sliding surface to translate along the locking tab sliding surface.

12. The method of claim 11, wherein the method includes actuating the release button from the first position to the second position without a tool to release the fire control panel module from the module carrier slot.

13. The method of claim 11, wherein the method includes providing a plurality of retention tabs on the release button configured to attach the release button to the module carrier.

14. The method of claim 11, wherein the method includes providing the locking ridge on a top surface of the fire control panel module.

* * * * *